US005714194A

United States Patent [19]

Komai et al.

[11] Patent Number: 5,714,194

[45] Date of Patent: Feb. 3, 1998

[54] METHOD FOR PRODUCING A FERROELECTRIC THIN FILM

[75] Inventors: Masaya Komai; Kazuya Ishihara, both of Tenri, Japan

[73] Assignee: Sharp Kabushiki Kaisha, Osaka, Japan

[21] Appl. No.: 447,426

[22] Filed: May 23, 1995

Related U.S. Application Data

[63] Continuation of Ser. No. 247,222, May 23, 1994, abandoned.

[30] Foreign Application Priority Data

Jun. 4, 1993 [JP] Japan .................................... 5-134982

[51] Int. Cl.[6] .............................. B05D 5/12; C23C 16/40

[52] U.S. Cl. ........................... 427/81; 427/79; 427/126.3; 427/248.1; 427/255.7; 427/314; 427/419.3

[58] Field of Search ............................. 427/126.3, 248.1, 427/255.7, 314, 81, 79, 419.3

[56] References Cited

U.S. PATENT DOCUMENTS

| | | | |
|---|---|---|---|
| 4,792,463 | 12/1988 | Okada et al. | 427/126.3 |
| 5,198,269 | 3/1993 | Swartz et al. | 427/226 |
| 5,271,955 | 12/1993 | Maniar | 427/226 |
| 5,316,579 | 5/1994 | McMillan et al. | 427/226 |

FOREIGN PATENT DOCUMENTS

| | | |
|---|---|---|
| 4-51407 | 2/1992 | Japan . |
| 5-90600 | 4/1993 | Japan . |

OTHER PUBLICATIONS

Yamaguchi et al, Appl. Phys. Lett. 55(15) Oct. 1989 pp. 1581–1582.

Gao et al, J. Appl. Phys. 71(5) Mar. 1992, pp. 2333–2337.

Ramamurthi, S.D., et al., "Sol–Gel Ferroelectric Films for Optical Waveguides"; Ceramic Transactions vol. 25, American Ceramic Society, 1992 pp. 353–370.

Haertling, G.H., "Current Status of Thin/Thick Film Ferroelectrics"; Ceramic Transactions vol. 25, American Ceramic Society, 1992, pp. 1–18.

Lee, H.Y., et al., "Preparation of $PbTiO_3$ Films by Chemical Vapor Deposition"; Ceramic Transactions vol. 25, American Ceramic Society, 1992, pp. 441–447.

*Primary Examiner*—Roy V. King
*Attorney, Agent, or Firm*—Nixon & Vanderhye P.C.

[57] ABSTRACT

A method for producing a ferroelectric thin film according to the present invention includes the steps of: forming a $PbTiO_3$ film on an electrode provided on a substrate; and forming a PZT film on the $PbTiO_3$ film by a CVD method.

6 Claims, 5 Drawing Sheets

Ar
O2
MFC
MFC
MFC
MFC
Ti(i-OC3H7)4
Zr(t-OC4H9)4
Pb(DPM)2
1a
1b
1c
2a
2b
2c
3a
3b
3c
4
5
6
7
8
9a
9b
9c

PZT (3000Å)
TiO2 (100Å)
Pt (2000Å)
Ti (300Å)
SiO2 (2000Å)
Si-substrate
26
25
24
23
22
21

TiO2 (100Å)
Pt (2000Å)
Ti (300Å)
SiO2 (2000Å)
Si-substrate
25
24
23
22
21

Pe(101)
Pe(100)
Py(222)
Py(400)
Pe(111)
Sample a
Sample b
20
25
30
35
40
2θ

METHOD FOR PRODUCING A FERROELECTRIC THIN FILM

This is a continuation of application Ser. No. 08/247,222 filed May 23, 1994 now abandoned.

BACKGROUND OF THE INVENTION

1. Field of the Invention

The present invention relates to a method for producing a ferroelectric thin film used as an insulating film of a capacitor in a highly integrated dynamic random access memory (DRAM) and a non-volatile random access memory (RAM).

2. Description of the Related Art

In recent years, highly integrated DRAMs taking advantage of a high dielectric constant of a ferroelectric material, non-volatile RAMs taking advantage of the hysteresis characteristic of the ferroelectric material, and the like, have been developed. As a material for an insulating film of a capacitor in such ferroelectric devices, three component perovskite oxide, i.e., $Pb(Zr, Ti)O_3$ (hereinafter, referred to as PZT) has most widely been used because of its high dielectric constant and hysteresis characteristics. As an electrode material for a capacitor of the device using PZT, platinum well matched with PZT is used.

Examples of a method for forming the PZT thin film include sol-gel, sputtering, and chemical vapor deposition (CVD) methods. The CVD method is the best of them, taking the controllability of film composition, step coverage, film uniformity, and the like into consideration.

In the past, the formation of the PZT thin film has been conducted by the CVD method as follows: A semiconductor substrate with the above-mentioned electrode formed thereon is heated to 550° C. to 600° C. in a reaction chamber kept at a pressure of about 5 Torr. Then, material gases including Pb, Zr, and Ti and $O_2$ are supplied to the reaction chamber so as to react with each other, whereby a PZT thin film is grown on the electrode for about one hour.

According to the conventional method, the PZT thin film is directly formed on the platinum electrode at a high temperature of around 600° C. This is likely to cause a reaction between Pt and Pb on the interface between PZT and Pt to form an alloy, resulting in the degradation of the electrical characteristics. In order to prevent the reaction between Pt and Pb, it is considered that the temperature for forming the PZT thin film be lowered. However, PZT cannot have a sufficient perovskite structure under 550° C., which means that the resultant PZT thin film has no satisfactory ferroelectricity.

SUMMARY OF THE INVENTION

The method for producing a ferroelectric thin film of this invention, comprises the steps of: forming a $PbTiO_3$ film on an electrode provided on a substrate; and forming a PZT film on the $PbTiO_3$ film by a CVD method.

In one embodiment of the present invention, the step of forming the $PbTiO_3$ film and the step of forming the PZT film are successively performed.

In another embodiment of the present invention, the step of forming the $PbTiO_3$ film is performed by the CVD method.

In another embodiment of the present invention, a temperature of the substrate is 550° C. or less during the steps of forming the $PbTiO_3$ film and of forming the PZT film.

In another embodiment of the present invention, the above-mentioned method further comprises the step of successively changing a ratio of flow rates of CVD materials for forming the $PbTiO_3$ film and the PZT film.

In another embodiment of the present invention, the above method further comprises the step of forming a thin film made of one compound selected from the group consisting of $TiO_2$, $ZrO_2$, and a mixture of $TiO_2$ and $ZrO_2$ on the electrode provided on the substrate before the step of forming the $PbTiO_3$ film, wherein, in the step of forming the $PbTiO_3$ film, the $PbTiO_3$ film is formed on the thin film made of one compound selected from the group consisting of $TiO_2$, $ZrO_2$, and a mixture of $TiO_2$ and $ZrO_2$.

Thus, the invention described herein makes possible the advantage of providing a method for producing a ferroelectric thin film in which a PZT thin film having a sufficient perovskite structure and satisfactory ferroelectric characteristic can be formed by a CVD method in a wide range of temperatures.

This and other advantages of the present invention will become apparent to those skilled in the art upon reading and understanding the following detailed description with reference to the accompanying figures.

DESCRIPTION OF THE PREFERRED EMBODIMENTS

EXAMPLES

Hereinafter, the present invention will be described by way of illustrative examples with reference to the drawings.

Example 1

Figures 2A, 2B:
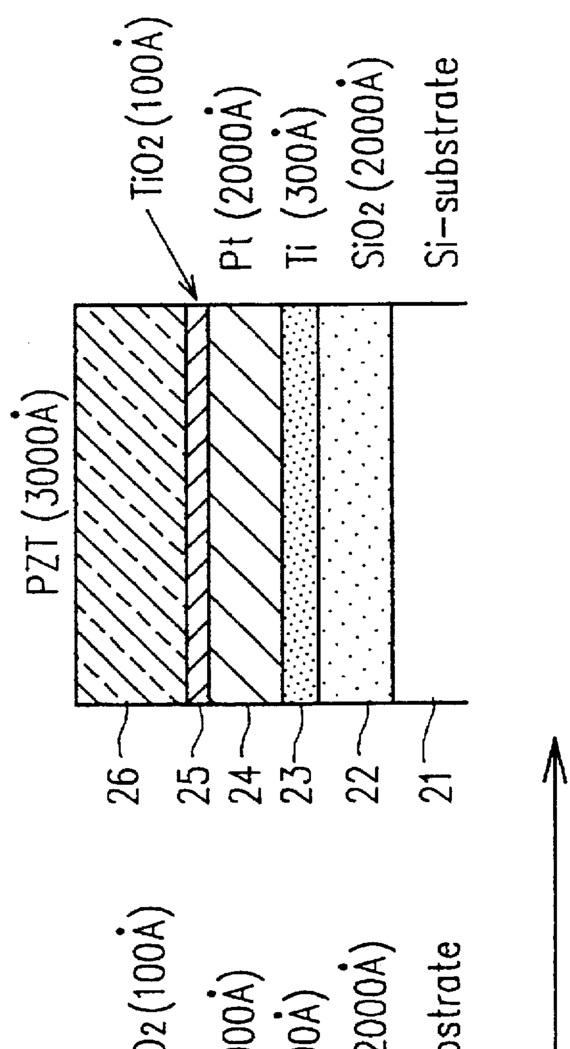
FIGS. 2A and 2B are cross-sectional views of a ferroelectric thin film, illustrating a method for producing the ferroelectric thin film of Example 1.

FIGS. 2A and 2B are cross-sectional views of a ferroelectric thin film obtained by the method of the present example. As shown in FIG. 2B, the ferroelectric thin film of the present example includes a capacitor insulating film with a two-layered structure made of a $TiO_2$ film 25 and a PZT film 26.

Referring to FIG. 2A, the surface of an Si substrate 21 is thermally oxidized to form an $SiO_2$ film 22 having a thickness of 2000 Å. Ti and Pt are deposited on the $SiO_2$ film 22 by magnetron sputtering so as to form a Ti film 23 and a Pt film 24 having a thickness of 300 Å and 2000 Å, respectively. The Ti film 23 and the Pt film 24 work as lower electrodes of the ferroelectric capacitor. The reason for forming the Ti film 23 is to improve the adhesion between the $SiO_2$ film 22 and the Pt film 24.

Next, the capacitor insulating film is formed on the substrate 21 with the lower electrode formed thereon. More specifically, the capacitor insulating film with a two-layered structure made of the $TiO_2$ film 25 and the PZT film 26 is formed as shown in FIG. 2B. The formation of such a capacitor insulating film can be conducted in an MOCVD (CVD using an organic metal complex material) device shown in FIG. 1.

Figure 1:
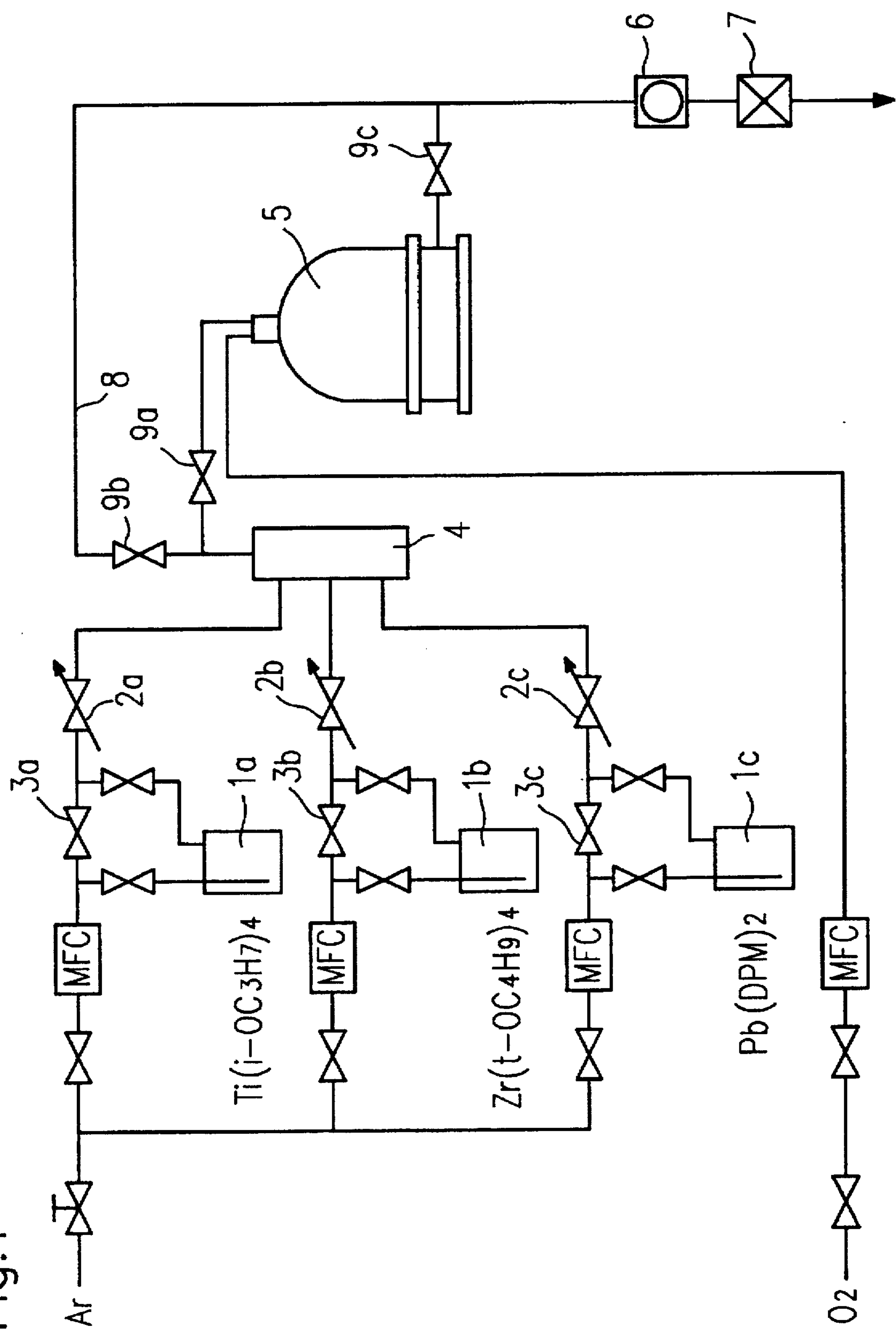
FIG. 1 is a schematic view showing an example of an MOCVD apparatus used as a method for producing a ferroelectric thin film according to the present invention.

Referring now to FIG. 1, the MOCVD apparatus includes containers 1a, 1b, and 1c having a function of keeping each material gas at a predetermined temperature. Ar carrier gas is supplied to the containers 1a, 1b, and 1c, followed by bubbling. Each material gas in the containers 1a, 1b, and 1c is forced to evaporate. The amount of Ar gas supplied to the respective containers 1a, 1b, and 1c is regulated by the corresponding mass flow controllers (MFCs). Needle valves 2a, 2b, and 2c respectively provided on exit sides of the containers 1a, 1b, and 1c regulate the pressure of each material gas. Material gas supply lines are respectively provided with bypass lines 3a, 3b, and 3c. Each material gas is supplied to a gas mixer 4 through the needle valves 2a, 2b, and 2c. The mixed material gas is supplied to a reaction chamber 5 made of quartz through a valve 9a. Oxygen gas is also supplied to the reaction chamber 5 through the MFC. The reaction chamber 5 is connected to a vacuum pump through a conductance valve (e.g., butterfly valve) 9c and a vent line 8. During the deposition of a film, the pressure in the reaction chamber 5 can be controlled by adjusting the conductance valve 9c under the condition that a valve 9b is closed and the valve 9a is opened. In the present example, the pressure in the reaction chamber 5 is kept at about 5 Torr during the formation of a ferroelectric thin film. By closing the valve 9a and the conductance valve 9c and opening the valve 9b, material gas can be discharged without passing through the reaction chamber 5. Gas containing poisonous Pb is discharged through a discharging tank 7. In order to prevent the material gasses from depositing in pipelines of the MOCVD apparatus through which each material gas flows, the pipelines are heated by a heater to a temperature higher than those of the containers 1a, 1b, and 1c and lower than decomposition temperatures of all of the material gasses.

A method for forming the capacitor insulating film using the above MOCVD apparatus will be described below.

As CVD materials (i.e., Ti, Zr, and Pb materials), $Ti(i\text{-}OC_3H_7)_4$, $Zr(t\text{-}OC_4H_9)_4$, $Pb(dipivaloylmethanate)_2$, and the like can be used. Hereinafter, dipivaloylmethanate is referred to as DPM.

First, the above-mentioned semiconductor substrate with the lower electrodes 23, and 24 formed thereon is placed in the reaction chamber 5. The substrate is heated to around 600° C. by an electric heater while producing a vacuum in the reaction chamber 5. After the substrate is raised to the intended temperature, oxygen gas is supplied to the reaction chamber 5 at a flow rate of 800 SCCM, thereby adjusting the pressure of the reaction chamber 5 to 5 Torr.

The Ti, Zr, and Pb materials are respectively kept at 40° C., 40° C., and 120° C. in the containers 1a, 1b, and 1c. Ar carrier gas at a flow rate of respectively 100 SCCM, 100 SCCM, and 200 SCCM is supplied to the bypass lines 3a, 3b, and 3c of the material gas supply lines. The pressure of the containers 1a and 1b are adjusted to around 300 Torr by the needle values 2a and 2b. The Pb material, i.e., $Pb(DPM)_2$ is solid, so that the needle valve 2c is kept open at all times.

Next, the supply of the Ar carrier gas is switched from the bypass lines 3a, 3b, and 3c to the containers 1a, 1b, and 1c in order to start the bubbling of the Ar carrier gas in the containers 1a, 1b, and 1c. In order to keep the pressure of each container at a predetermined value, the Ti, Zr, and Pb materials are discharged through the vent line 8 for a few minutes. When the pressure of each container reaches a predetermined value, the supply of the Ar carrier gas for the Zr and Pb materials is switched to the bypass lines 3b and 3c, whereby only the Ti material flows into the gas mixer 4. Under this condition, the supply of the Ti material from the gas mixer 4 is switched from the vent line 8 to the reaction chamber 5 in order to start the deposition of the $TiO_2$ film. The deposition is conducted for a few minutes so as to obtain the $TiO_2$ film having a thickness of about 100 Å as shown in FIG.2A.

The supply of the Ar carrier gas for the Zr and Pb materials is switched from the bypass lines 3b and 3c to the containers 1b and 1c, whereby the Zr and Pb materials are supplied to the reaction chamber 5. Thus, the Ti, Zr, and Pb materials are introduced into the reaction chamber 5 to start the deposition of the PZT film 26 shown in FIG. 2B. When the PZT film 26 is deposited to a thickness of 3000 Å, the supply of the Ti, Zr, and Pb materials is switched to the vent line 8 to stop the formation of the film. The substrate is sufficiently cooled by gradually lowering the temperature of the electric heater. The reaction chamber 5 is opened to the air and the substrate is taken out.

The PZT film 26 is formed above the Pt film 24 with the $TiO_2$ film 25 having a thickness of about 100 Å containing no Pb sandwiched therebetween. Thus, although the PZT film 26 is formed by the CVD method at a high temperature of 600° C. or more, Pb contained in the PZT film 26 does not react with Pt. More specifically, although the PZT film 26 is formed by the CVD method at a high temperature of 600° C. or more so as to have a perovskite structure, the electrical characteristics does not deteriorate. A ferroelectric device using the PZT film 26 thus formed as the capacitor insulating film will have excellent electrical characteristics.

In the present example, a $ZrO_2$ film and a film made of a mixture of $TiO_2$ and $ZrO_2$ can be used instead of the $TiO_2$ film 25. In the case where the $ZrO_2$ film is formed, a Zr material and oxygen gas are supplied to the reaction chamber 5; in the case where the film made of the mixture of $TiO_2$ and $ZrO_2$ is formed, Ti and Zr materials and oxygen gas are supplied to the reaction chamber 5. In either case, a film containing no Pb is formed between the PZT film 26 and the Pt film 24, so that Pb contained in the PZT film 26 is not reacted with Pt. Thus, a ferroelectric device using a capacitor insulating film including the $ZrO_2$film or the film made of the mixture of $TiO_2$ and $ZrO_2$instead of the $TiO_2$ film 25 will also have excellent electrical characteristics.

Example 2

Figure 3:
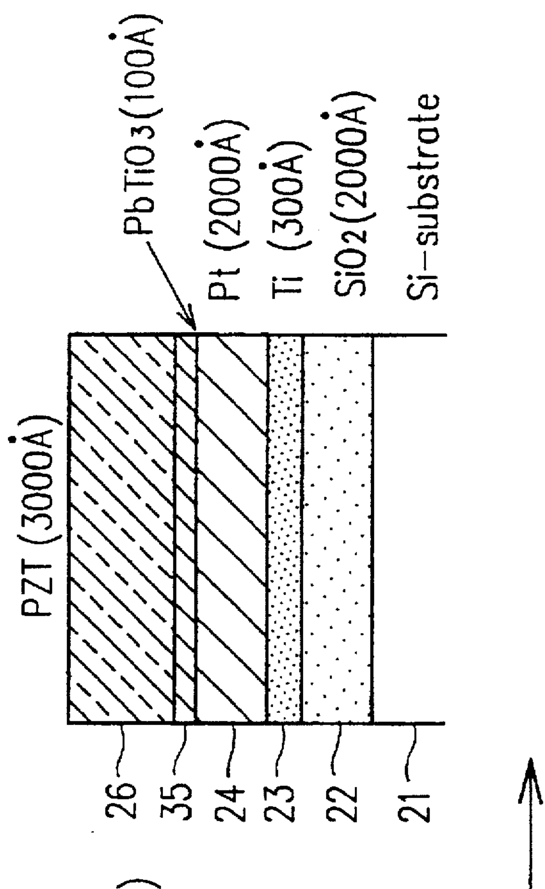
FIGS. 3A and 3B are cross-sectional views of a ferroelectric thin film, illustrating a method for producing the ferroelectric thin film of Example 2.

FIGS. 3A and 3B are cross-sectional views of a ferroelectric thin film obtained by the method of the present example. As shown in FIG. 3B, the ferroelectric thin film of the present example includes a capacitor insulating film with a two-layered structure made of a $PbTiO_3$ film 35 and a PZT film 26.

Hereinafter, a method for producing the ferroelectric thin film of the present example will be described. The formation of the ferroelectric thin film of the present example can be conducted using the MOCVD apparatus of FIG. 1.

As CVD materials (i.e., Ti, Zr, and Pb materials), $Ti(i\text{-}OC_3H_7)_4$, $Zr(t\text{-}OC_4H_9)_4$, $Pb(DPM)_2$, and the like can be used.

First, the semiconductor substrate 21 with the lower electrodes 23 and 24 formed thereon is placed in the reaction chamber 5 in the same way as in Example 1. The substrate is heated to around 550° C. by an electric heater while producing a vacuum in the reaction chamber 5. After the substrate is raised to the intended temperature, Pb and Ti materials and oxygen gas are supplied to the reaction chamber 5 so as to deposit the $PbTiO_3$ film 35 having a thickness of about 10 to 100 Å. Since $PbTiO_3$ has a perovskite structure even at 550° C., the $PbTiO_3$ film 35 thus obtained will have a perovskite structure. The $PbTiO_3$film 35 with a perovskite structure can be obtained at a temperature in the range of 500° C. to 550° C.

After the formation of the $PbTiO_3$ film 35, Ti, Zr, and Pb materials are supplied to the reaction chamber 5 in the same way as in Example 1, thereby forming the PZT film 26 having a thickness of 3000 Å on the $PbTiO_3$ film 35.

Figure 4:
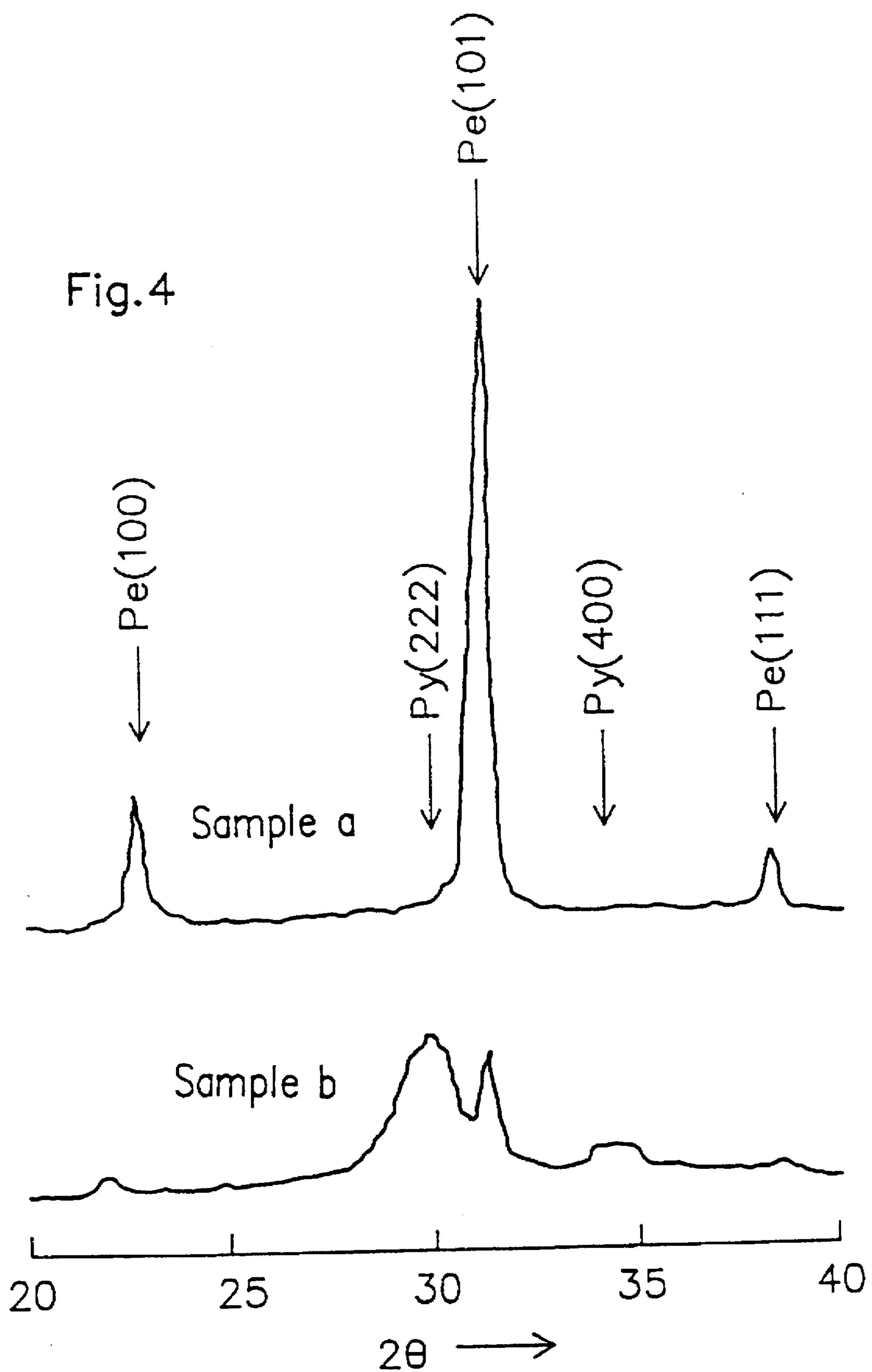
FIG. 4 shows X-ray diffraction patterns of PZT thin films of Example of the present invention and Comparative Example.

FIG. 4 shows an X-ray diffraction pattern of the PZT film 26 (Sample a) thus obtained. FIG. 4 also shows, as a comparative example, an X-ray diffraction pattern of a PZT film (Sample b) directly formed on the Pt film.

TABLE 1

| | Sample a | Sample b |
|---|---|---|
| Substrate temperature | 550° C. | 550° C. |
| Film formation pressure | 5 Torr | 5 Torr |
| Flow rate of $Pb(DPM)_2$ | 200 SCCM | 200 SCCM |
| Flow rate of $Zr(t\text{-}OC_4H_9)_4$ | 100 SCCM | 100 SCCM |
| Flow rate of $Ti(i\text{-}OC_3H_7)_4$ | 100 SCCM | 100 SCCM |
| Flow rate of $O_2$ | 800 SCCM | 800 SCCM |
| Growth time of PZT | 2 hours | 2 hours |
| Growth time of $PbTiO_3$ | 5 min | — |

In FIG. 4, Pe represents a perovskite phase and Py represents a pyrochlore phase. As is apparent from FIG. 4, in the X-ray diffraction pattern of Sample b (comparative example), a peak of a perovskite phase having ferroelectricity is weak and a pyrochlore phase having no ferroelectricity also appears. This reveals that the PZT phase is not sufficiently crystallized (i.e., a phase transition to a perovskite phase is not sufficiently effected) at 550° C. In contrast, in the X-ray diffraction pattern of Sample a (example of the present invention), peaks of the perovskite phase are very strong and peaks of the pyrochlore phase disappear. This reveals that the PZT film 26 formed on the $PbTiO_3$ film 35 is sufficiently crystallized (i.e., a phase-transition to the perovskire phase is sufficiently effected) even at 550° C. More specifically, when the PZT film is deposited on the $PbTiO_3$ film having a perovskite structure by the CVD method, the PZT film is epitaxially grown so as to be lattice-matched with $PbTiO_3$ crystal nuclei having a perovskite structure. This made it possible to obtain the PZT film having a perovskite structure excellent in density even at a lower temperature of 550° C. or less. The $PbTiO_3$ film having a perovskite structure can be formed in a range of 500° C. to 550° C. Thus, the PZT film having a perovskite film can also be formed in the range of 500° C. to 550° C.

In the CVD method, the composition ratio of an interface region of the $PbTiO_3$ film and the PZT film can be successively changed by successively changing the ratio of flow rates of materials during the film formation. Because of this, it is easy to control the matching of a crystal structure between the $PbTiO_3$ film and the PZT film, resulting in the easy formation of the PZT film having a perovskite structure.

Figures 5A, 5B:
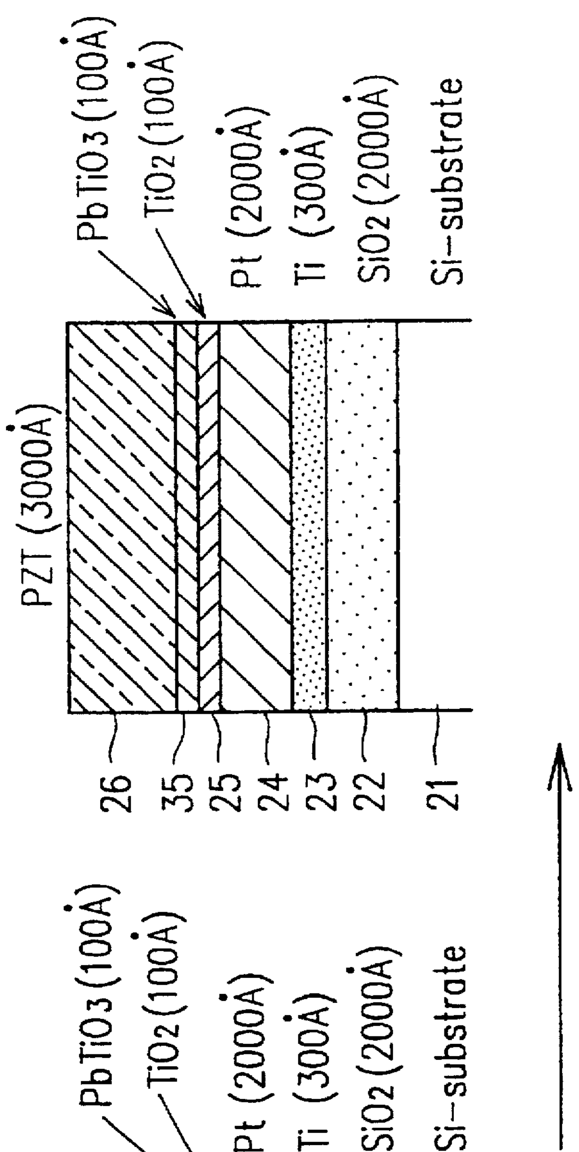
FIGS. 5A and 5B are cross-sectional views of a ferroelectric thin film, illustrating another method for producing the ferroelectric thin film of Example 2.

As shown in FIGS. 5A and 5B, in order to prevent the reaction between Pb contained in the $PbTiO_3$and Pt, the $TiO_2$ film is formed on the Pt film as in Example 1, and the $PbTiO_3$ film having a perovskite structure is formed on the $TiO_2$ film. The reaction between Pb contained in the $PbTiO_3$ film and Pt can also be prevented by forming a $ZrO_2$ film or a film made of a mixture of $TiO_2$ and $ZrO_2$ instead of the $TiO_2$ film. The thickness of the $TiO_2$ film, the $ZrO_2$ film, and the film made of the mixture of $TiO_2$ and $ZrO_2$ is preferably 100 Å or less. Since the crystal structure of these films is completely different from the perovskite structure, if either of these films is formed to a thickness exceeding 100 Å, the crystal structure of the $PbTiO_3$ film to be formed on either of these films is not likely to have a perovskite structure. As a result, the crystal structure of the PZT film to be formed on the $PbTiO_3$ film is not likely to have a perovskite structure. Thus, in order to effect a phase-transition of the PZT film to the perovskite structure, the layered structure needs to be annealed at 600° C. or more. Even if the layered structure is annealed at 600° C. or more, the reaction between Pb contained in the $PbTiO_3$ film and Pt can be prevented because of the presence of the $TiO_2$ film on the Pt film; however, it is preferred that the ferroelectric film is formed at a lower temperature, considering a production cost and the like.

As described above, according to the first example of the present invention, the $TiO_2$ film, $ZrO_2$ film or the film made of the mixture of $TiO_2$ and $ZrO_2$ is formed on the Pt film before forming the PZT film. Even though the PZT film is formed by the CVD method at a high temperature of 600° C. or more, Pb contained in the PZT film is not reacted with Pt. As a result, a PZT film having a satisfactory perovskite structure can be formed even at a high temperature of 600° C. or more without the deterioration of the electric characteristics.

According to the second example of the present invention, since the $PbTiO_3$ film is formed before forming the PZT film, the PZT film can be epitaxially grown so as to be lattice-matched with $PbTiO_3$ crystal nuclei. As a result, a PZT film having a perovskite structure excellent in density can be formed even at a low temperature of 550° C. or less.

Thus, according to the present invention, a PZT film exhibiting satisfactory ferroelectricity can be easily formed in a wider range of temperatures.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a ferroelectric thin film comprising the steps of:

depositing a $PbTiO_3$ film having a perovskite structure by a chemical vapor deposition method (CVD) on an electrode provided on a substrate;

depositing a PZT film having a perovskite structure on the $PbTiO_3$ film by the CVD method;

wherein the $PbTiQ_3$ film and the PZT film are ferroelectric films;

wherein the step of depositing the $PbTiO_3$ film and the step of depositing the PZT film are successively performed, and wherein, during the depositing of the PZT film, the PZT film grows with a perovskite structure.

2. A method for producing a ferroelectric thin film according to claim 1, wherein a temperature of the substrate is 550° C. or less during the steps of depositing the $PbTiO_3$ film and of depositing the PZT film.

3. A method for producing a ferroelectric thin film according to claim 1, further comprising the step of successively changing a ratio of flow rates of CVD materials for depositing the $PbTiO_3$ film and the PZT film.

4. A method for producing a ferroelectric thin film according to claim 1, further comprising the step of forming a thin film made of one compound selected from the group consisting of $TiO_2$, $ZrO_2$, and a mixture of $TiO_2$ and $ZrO_2$ on the electrode provided on the substrate before the step of depositing the $PbTiO_3$ film, wherein the $PbTiO_3$ film is deposited on the thin film.

5. A method for producing a ferroelectric thin film comprising the steps of:

depositing a $PbTiO_3$ film having a perovskite structure by a chemical vapor deposition method (CVD) on an electrode provided on a substrate;

depositing a PZT film having a perovskite structure on the $PbTiO_3$ film by the CVD method;

wherein the $PbTiO_3$ film and the PZT film are ferroelectric films; and wherein a temperature of the substrate is 550° C. or less during the steps of depositing the $PbTiO_3$ film and of depositing the PZT film.

6. A method for producing a ferroelectric thin film according to claim 5, wherein the step of forming the $PbTiO_3$ film and the step of forming the PZT film are successively performed.

* * * * *